United States Patent
Srinivasan et al.

(10) Patent No.: US 8,136,073 B1
(45) Date of Patent: Mar. 13, 2012

(54) CIRCUIT DESIGN FITTING

(75) Inventors: Sankaranarayanan Srinivasan, San Jose, CA (US); Damon McCormick, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 406 days.

(21) Appl. No.: 12/429,842

(22) Filed: Apr. 24, 2009

(51) Int. Cl.
*G06F 17/50* (2006.01)

(52) U.S. Cl. .......................................... 716/119

(58) Field of Classification Search .................. 716/100, 716/119
See application file for complete search history.

(56) References Cited

U.S. PATENT DOCUMENTS

| | | | | |
|---|---|---|---|---|
| 5,847,965 | A * | 12/1998 | Cheng | 716/123 |
| 5,875,117 | A * | 2/1999 | Jones et al. | 716/124 |
| 5,971,588 | A * | 10/1999 | Scepanovic et al. | 700/121 |
| 6,155,725 | A * | 12/2000 | Scepanovic et al. | 716/122 |
| 6,493,658 | B1 * | 12/2002 | Koford et al. | 703/1 |
| 7,921,393 | B2 * | 4/2011 | Furnish et al. | 716/110 |
| 7,979,831 | B1 * | 7/2011 | Srinivasan | 716/122 |
| 2009/0083689 | A1 * | 3/2009 | Ringe et al. | 716/12 |
| 2009/0254874 | A1 * | 10/2009 | Bose | 716/6 |

OTHER PUBLICATIONS

U.S. Appl. No. 12/272,496, filed Nov. 17, 2008, Srinivasan.
U.S. Appl. No. 12/429,991, filed Apr. 24, 2009, Fang et al.

* cited by examiner

*Primary Examiner* — Suchin Parihar
(74) *Attorney, Agent, or Firm* — W. Eric Webostad; Kevin T. Cuenot

(57) ABSTRACT

Circuit design fitting for an integrated circuit is described. A mapped design for the circuit design is obtained. A first placement of the mapped design in association with an integrated circuit is performed. Circuit blocks are marked associated with the integrated circuit with control set identifiers. A circuit object is associated with a control set identifier. A site for placement of the first circuit object is located. The site is associated with a circuit resource block, which is associated with circuit resource blocks of the integrated circuit. Nearest neighbor circuit resource blocks with respect to the circuit resource block are acquired. The nearest neighbor circuit resource blocks of the circuit resource block are categorized in response to statuses. The circuit object is placed in a nearest neighbor of the nearest neighbor circuit resource blocks of the circuit resource block for a second placement.

20 Claims, 5 Drawing Sheets

CIRCUIT DESIGN FITTING

FIELD OF THE INVENTION

The invention relates to integrated circuit devices ("ICs"). More particularly, the invention relates to circuit design fitting for an IC.

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As is known, a circuit design is conventionally described using a computer aided design ("CAD"), such as an Electronic Design Automation ("EDA") tool set. Such a tool set conventionally produces what is referred to as a synthesized design, namely translated from a register transfer language ("RTL") description, such as in a Hardware Description Language ("HDL") such as Verilog or VHDL, among other formats, into a discrete network listing ("netlist") of logic-gate primitives. Such a synthesized circuit design is subsequently mapped to circuit resources of a PLD, such as an FPGA. This is to ensure that there are a sufficient number of resources, such as programmable circuit resources of an FPGA, for instantiation of the circuit design. This is sometimes referred to as a "floating netlist" as actual resources of an FPGA are not allocated; rather an x-axis versus y-axis spreading of logic-gate primitives of the netlist is output from a global placement. However, even though a global placement is not actual placement of circuit resources on an FPGA grid, such global placement does produce a real-valued placement of objects, namely objects associated with logic-gate primitives, in x- and y-axes.

A placer tool for global placement uses a force directed analytical placement engine to spread a circuit design, namely primitives of a netlist. Output from a global placement phase conventionally results in design blocks with real-valued placement information sparsely overlapped. Such a global placement is used to obtain real-valued placement information for a more detailed placement.

The placer tool used for global placement may include a detailed placement engine for a fitting stage. Such detailed placement engine obtains the placement information from the global placement as input and produces a non-overlapping placement for an FPGA grid. By overlapping, it should be understood that a global placement does not take into account control set conflicts. Thus, during a global placement stage, two circuit blocks may be placed in the same site or region of an FPGA grid without taking into account that such circuit blocks are incompatibly placed due to control set conflicts.

A control set is a combination of clock and control signals associated with a block of circuitry. The control signal(s) of a control set may include one or more of an enable signal, a set signal, a reset signal, or a rev signal for FPGAs available from Xilinx, Inc., of San Jose, Calif. Control sets control sequential elements of a design, such as registers. Accordingly, each sequential element has associated therewith a control set. A hardware restriction for FPGAs, such as FPGAs from Xilinx, Inc., is that each register or lookup table random access memory ("LUTRAM") in a "slice" of an FPGA CLB should have the same control set. If the control sets are not the same, resynthesis in some instances may be used to promote one or more related control sets, for making them compatible.

However, some control sets are not compatible with other control sets. Accordingly, only elements with the same control sets, including resynthesized compatible control sets, may be placed in a same slice. Heretofore, if during a global placement, incompatible control sets for registers were placed in a same slice, then conventionally, one of the control sets was moved and placed in an empty slice to resolve the compatibility conflict. However, this utilization of slices may have a negative impact on utilization of circuit resources.

For FPGA implementers of circuit designs, slice utilization is a considered parameter. Designers conventionally want some room in their device to add more logic, if necessary, for engineering change orders, updates, or for other types of changes. Additionally, lower slice utilization may be desirable from a standpoint of reducing routing issues. Lower slice utilization may further be beneficial from a power standpoint, as less routing resources are used outside of CLBs.

Accordingly it would be desirable and useful to provide means for a fitting that enhances slice utilization over the above-described conventional detailed placement.

SUMMARY OF THE INVENTION

One or more aspects generally relate to circuit design fitting for an IC.

An embodiment relates generally to a method for fitting a circuit design having been synthesized. A mapped design for the circuit design is obtained. A first placement of the mapped design in association with an integrated circuit is performed. A congestion map is generated responsive to the first placement. Overflow conditions in the congestion map are identified. A list of sequential circuit objects for a second placement is created responsive at least in part to the overflow conditions identified. Circuit blocks are marked associated with the integrated circuit with control set identifiers. A first circuit object is selected from the list of the sequential circuit objects. The first circuit object is associated with a first control set identifier. A site for placement of the first circuit object is located. The site is associated with a first circuit resource block, which is associated with circuit resource blocks of the integrated circuit. Nearest neighbor circuit resource blocks with respect to the first circuit resource block are acquired. The nearest neighbor circuit resource blocks of the first circuit resource block are categorized in response to statuses. The first circuit object is placed in a nearest neighbor of the nearest neighbor circuit resource blocks of the first circuit resource block for a second placement. The nearest neighbor has associated therewith a categorization from the categorizing including the first control set identifier of the first circuit object.

In one or more other embodiments of a method for fitting a circuit design having been synthesized, one or more of the following aspects may be included. The method may further comprise repeating the selecting, the locating, the acquiring, the categorizing, and the placing for each of the sequential circuit objects on the list to complete the second placement. The statuses may include categories of control set identifiers and an unused category. The categorizing of the nearest neighbor circuit resource blocks may include labeling the nearest neighbor circuit resource blocks as one of identical to the first control set identifier, related to the first control set identifier, incompatible with the first control set identifier, or unused. The method may further comprise sorting the overflow conditions of the circuit resource blocks used in the first placement from most overflowing to least overflowing to provide the list and initiating the second placement by selection of the first circuit object in association with the first circuit resource block, wherein the first circuit resource block is the most overflowing. The method may further comprise sorting the sequential circuit objects according to size and timing to provide the list.

The sequential circuit objects may be sized responsive to number of objects in associated relationally placed macros. The first placement may be a global placement; and the second placement may be a detailed placement. The sequential circuit objects may include registers. The acquiring of the nearest neighbor circuit resource blocks of the first circuit resource block may include: snapping the first circuit object to the site; the site being associated with a grid of the circuit resource blocks; and performing a first spiral search to acquire the nearest neighbor circuit resource blocks of the first circuit resource block. The integrated circuit may be a Field Programmable Gate Array ("FPGA"), and the grid may be an FPGA grid of the circuit resource blocks. The sequential circuit objects may represent clocked flip-flops and look-up table random access memories. The acquiring of the nearest neighbor circuit resource blocks of the first circuit resource block may be for a portion of the congestion map responsive to a scalable window. The integrated circuit may be a Field Programmable Gate Array ("FPGA"); the grid may be an FPGA grid of the circuit resource blocks; the scalable window may be for selection of a portion of the FPGA grid; and the scalable window may have a granularity of at least one slice per bin of the congestion map. The placing of the first circuit object in the nearest neighbor of the nearest neighbor circuit resource blocks of the first circuit resource block may be favored over placement in another of the nearest neighbor circuit resource blocks having a higher priority but with an unused status.

The method may further comprise: selecting a second circuit object from the list of the sequential circuit objects; the second circuit object associated with a second control set identifier different from the first control set identifier; locating another site for placement of the second circuit object; the other site being associated with a second circuit resource block; the second circuit resource block being associated with the circuit resource blocks of the integrated circuit; acquiring nearest neighbor circuit resource blocks with respect to the second circuit resource block; categorizing the nearest neighbor circuit resource blocks of the second circuit resource block responsive to statuses thereof; placing the second circuit object in a nearest neighbor of the nearest neighbor circuit resource blocks of the second circuit resource block having the unused status for the second placement; the nearest neighbor having associated therewith another categorization from the categorizing including the second control set identifier of the second circuit object; the first control set identifier and the second control set identifier being related wherein the first circuit object and the second circuit object are capable of being resynthesized for placement of the second circuit object in the first circuit object; and the placing of the second circuit object in the nearest neighbor of the nearest neighbor circuit resource blocks of the second circuit resource block is favored over yet another of the nearest neighbor circuit resource blocks having another higher priority with a compatible status.

In another embodiment of a method for fitting a circuit design having been synthesized, a machine-readable medium has stored thereon information representing instructions that, when executed by a processor, cause the processor to perform operations comprising: obtaining a mapped design for a circuit design; performing a first placement of the mapped design in association with an integrated circuit; generating a congestion map responsive to the first placement; identifying overflow conditions in the congestion map; creating a list of sequential circuit objects for a second placement responsive at least in part to the overflow conditions identified; marking circuit blocks associated with the integrated circuit with control set identifiers; selecting a first circuit object from the list of the sequential circuit objects, wherein the first circuit object is associated with a first control set identifier; locating a site for placement of the first circuit object, wherein the site is associated with a first circuit resource block, and the first circuit resource block is associated with circuit resource blocks of the integrated circuit; acquiring nearest neighbor circuit resource blocks with respect to the first circuit resource block; categorizing the nearest neighbor circuit resource blocks of the first circuit resource block in response to statuses; and placing, with a placer operative with the processor, the first circuit object in a nearest neighbor of the nearest neighbor circuit resource blocks of the first circuit resource block for a second placement, wherein the nearest neighbor is associated with a categorization from the act of categorizing including the first control set identifier of the first circuit object.

In yet another embodiment of a method for fitting a circuit design having been synthesized, the method includes steps of: obtaining a mapped design for the circuit design; performing a first placement of the mapped design in association with an integrated circuit; marking circuit blocks associated with the integrated circuit with control set identifiers; selecting a first circuit object from a list of the sequential circuit objects; the first circuit object associated with a first control set identifier; locating a site for placement of the first circuit object; the site being associated with a first circuit resource block; the first circuit resource block being associated with circuit resource blocks of the integrated circuit; acquiring nearest neighbor circuit resource blocks with respect to the first circuit resource block; categorizing the nearest neighbor circuit resource blocks of the first circuit resource block in response to statuses; placing with a placer operating in a computer the first circuit object in a nearest neighbor of the nearest neighbor circuit resource blocks of the first circuit resource block for a second placement; and the nearest neighbor having associated therewith a categorization from the categorizing including the first control set identifier of the first circuit object.

In one or more other embodiments of a method for fitting a circuit design having been synthesized, one or more of the following steps may be included: generating a congestion map responsive to the first placement; identifying overflow conditions in the congestion map; creating a list of sequential circuit objects for the second placement responsive at least in part to the overflow conditions identified, where the overflow conditions calculated with a processor of the computer; and repeating the selecting, the locating, the acquiring, the categorizing, and the placing for each of the sequential circuit objects on the list to complete the second placement. The statuses may include categories of control set identifiers and an unused category; and the categorizing of the nearest neighbor circuit resource blocks includes labeling the nearest neighbor circuit resource blocks as one of identical to the first control set identifier, related to the first control set identifier, incompatible with the first control set identifier, or unused.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1:
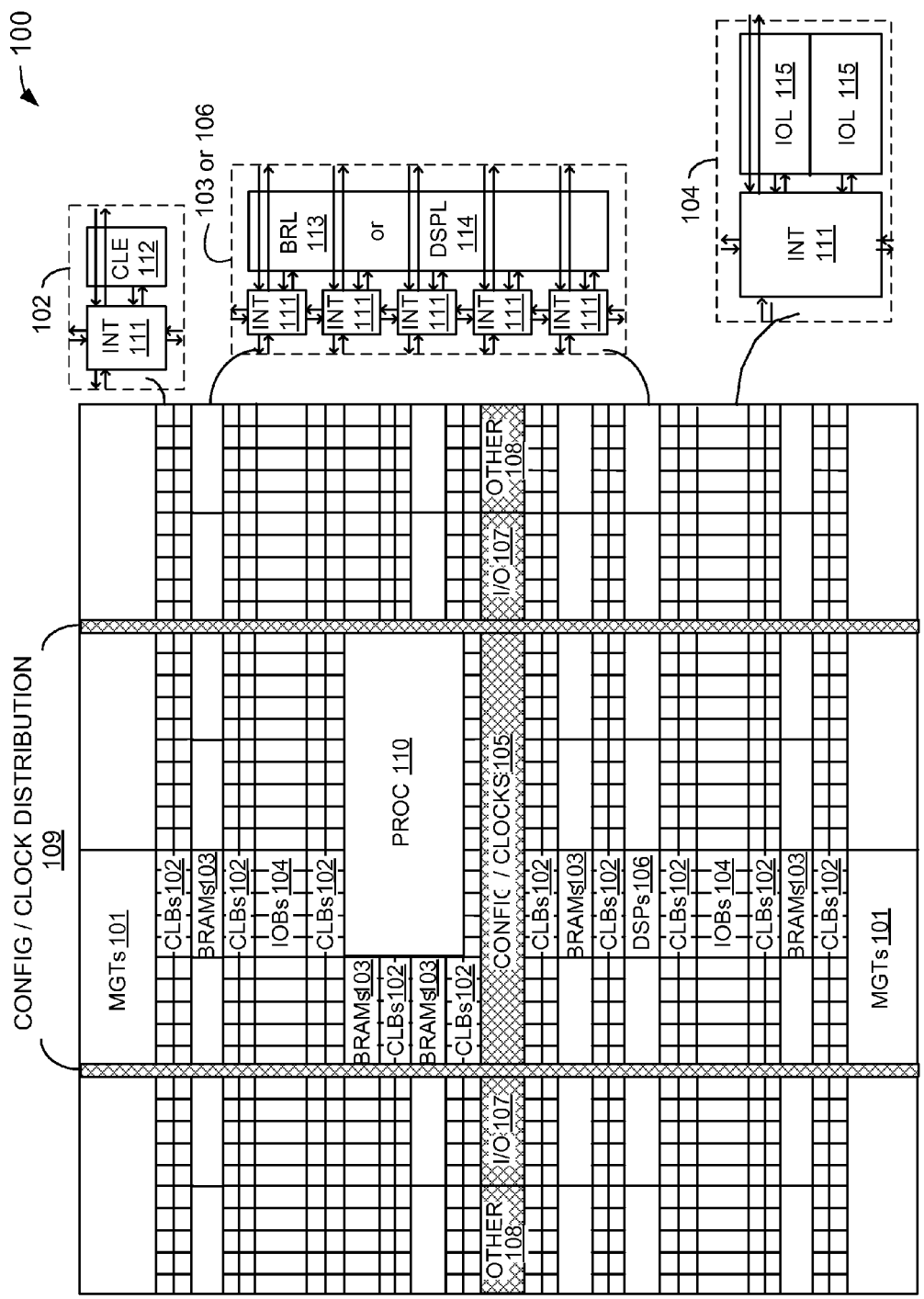
FIG. 1 is a simplified block diagram depicting an exemplary embodiment of a columnar Field Programmable Gate Array ("FPGA") architecture in which one or more aspects of the invention may be implemented.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a horizontal area near the center of the die (shown in FIG. 1) is used for configuration, clock, and other control logic. Vertical columns 109 extending from this horizontal area are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a horizontal column, the relative width of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

For purposes of explanation, specific nomenclature is set forth to provide a thorough understanding of the various inventive concepts disclosed herein. However, the terminology used herein is for the purpose of describing particular embodiments only and is not intended to be limiting of the invention. As used herein, the singular forms "a", "an" and "the" are intended to include the plural forms as well, unless the context clearly indicates otherwise. As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. It will also be understood that the term "and/or" as used herein refers to and encompasses any and all possible combinations of one or more of the associated listed items. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof. It will also be understood that, although the terms first, second, etc. may be used herein to describe various elements, these elements should not be limited by these terms, as these terms are only used to distinguish one element from another.

Some portions of the detailed descriptions that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those involving physical manipulations of physical quantities. Usually, though not necessarily, these quantities take the form of electrical, optical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following description, it should be appreciated that throughout the description, statements utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and/or memories into other data similarly represented as physical quantities within the computer system memories and/or registers or other such information storage, transmission or display devices.

Embodiments may be of the form of a computer program product on a computer-usable storage medium having computer-usable program code in the medium. Any suitable computer usable or computer readable medium may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory ("RAM"), a read-only memory ("ROM"), an erasable programmable read-only memory ("EPROM"), Flash memory, an optical fiber, a portable compact disc read-only memory ("CD-ROM"), an optical storage device, a transmission media such as those supporting the Internet or an intranet, or a magnetic storage device. A computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device.

Computer program code for carrying out operations in accordance with concepts described herein may be written in an object oriented programming language such as Java, Smalltalk, C++ or the like. However, the computer program code for carrying out such operations may be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network ("LAN") or a wide area network ("WAN"), or the connection may be made to an external computer (for example, through the Internet using an Internet Service Provider).

Systems and methods described herein may relate to an apparatus for performing the operations associated therewith. This apparatus may be specially constructed for a predetermined purpose, or it may comprise a general-purpose computer selectively activated or reconfigured by a computer program stored in the computer.

Notwithstanding, the algorithms presented herein are not inherently related to any particular computer or other apparatus. Various general-purpose systems may be used with programs in accordance with the teachings herein, or it may prove convenient to construct a more specialized apparatus to perform the operations. In addition, even if the following description is with reference to a programming language, it should be appreciated that any of a variety of programming languages may be used to implement the teachings as described herein.

The embodiments are described below with reference to flowchart illustrations and/or block diagrams of methods, apparatus (including systems) and computer program products. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer-readable memory that can direct a computer or other programmable data processing apparatus to function in a particular manner, such that the instructions stored in the computer-readable memory produce an article of manufacture including instruction means which implement the function/act specified in the flowchart and/or block diagram block or blocks. The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

The flowcharts and block diagrams in the Figures illustrate the architecture, functionality, and operation of possible implementations of apparatuses (including systems), methods and computer program products according to various embodiments. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Furthermore, each block of the block diagrams and/or flowchart illustration, and combinations of blocks in the block diagrams and/or flowchart illustration, can be implemented by special purpose hardware-based systems which perform the specified functions or acts, or combinations of special purpose hardware and computer instructions.

It should be understood that although the flow charts provided herein show a specific order of operations, it is understood that the order of these operations may differ from what is depicted. Also two or more operations may be performed concurrently or with partial concurrence. Such variation will depend on the software and hardware systems chosen and on designer choice. It is understood that all such variations are within the scope of the invention. Likewise, software and web implementations of the invention could be accomplished with standard programming techniques with rule based logic and other logic to accomplish the various database searching operations, correlation operations, comparison operations and decision operations. It should also be noted that the word "component" as used herein is intended to encompass implementations using one or more lines of software code, and/or hardware implementations, and/or equipment for receiving manual inputs.

As previously indicated, some FPGAs, such as those from Xilinx, Inc. of San Jose, Calif., have control set restrictions for sequential elements such as flip-flops and LUTRAMs. As described below in additional detail, a more control set aware fitting algorithm is described for a placer tool ("placer"). Such fitting algorithm is a relatively "greedy" heuristic to encourage slice packing by pre-filtering neighborhood slices from a standpoint of control set compatibility. Such filtering uses a compatible control set slice for register placement before designating a previously empty slice for such placement. Even with control set restrictions, such fitting algorithm may substantially enhance slice utilization.

Figure 2:
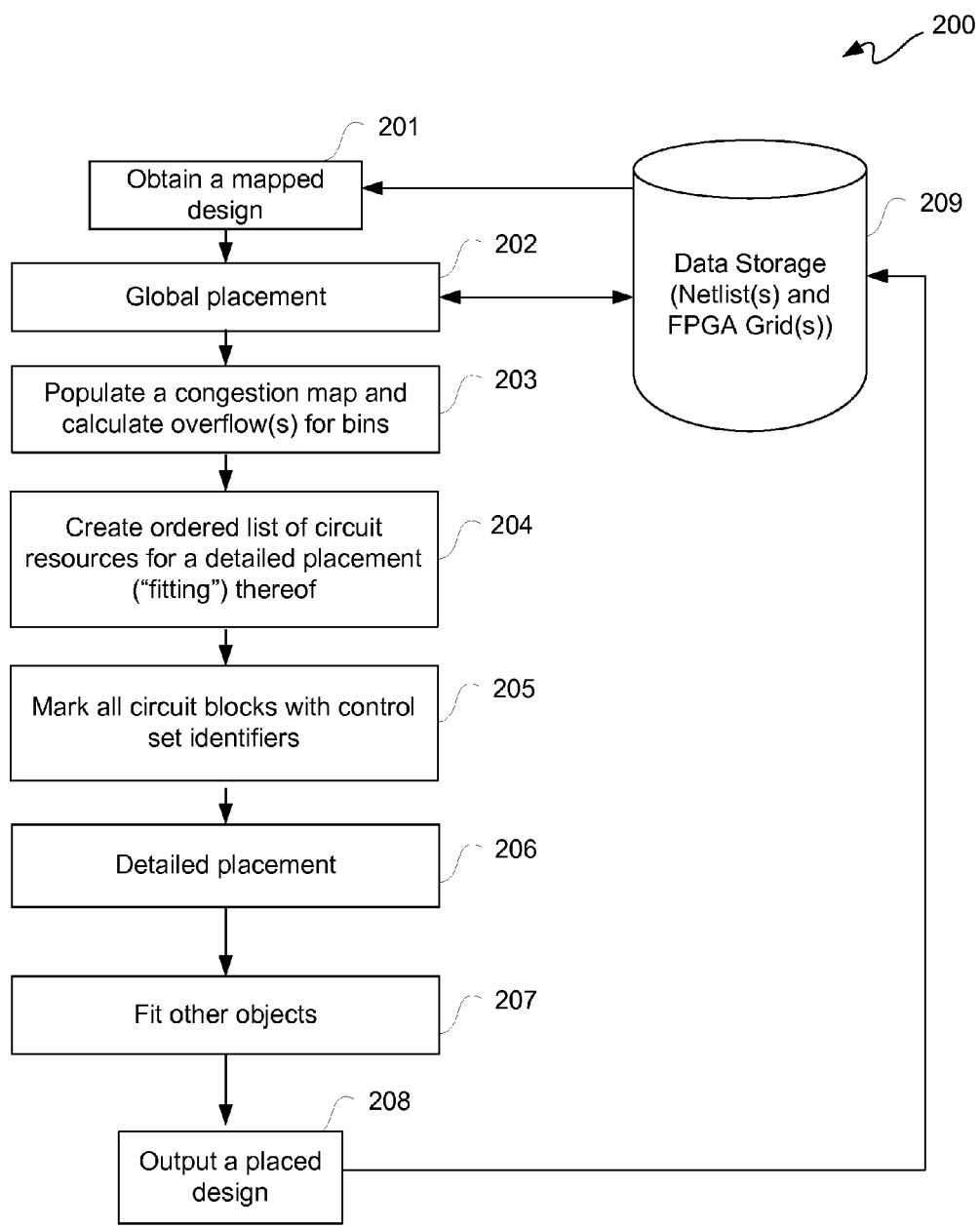
FIG. 2 is a flow diagram depicting an exemplary embodiment of a placement flow.

FIG. 2 is a flow diagram depicting an exemplary embodiment of a placement flow 200. Placement flow 200 is used to produce a placed design 208, which may be stored in data storage 209. It should be understood that placement flow 200 illustratively depicts a placement engine which may be incorporated in a placer for communicating with data storage 209.

At 201 a mapped design is obtained. Such mapped design may be obtained from data storage 209. A mapped design may be represented as a netlist. Mapping verifies that there are a sufficient number of resources for implementation of a circuit design in an FPGA or other device having programmable logic resources.

At 202, a global placement is performed. Such global placement at 202 may be a conventional global placement. Thus a conventional global placer may be run to provide an initial general placement of a circuit design with respect to x- and y-axes. The global placement at 202 may produce a placement with some number of overlaps to a minimum number of overlaps as a result of a force directed analytical placement routine. However, some overlaps or overflows may exist after such placement. The output of global placement 202 is a real-valued placement for objects in x- and y-axes, but not an actual placement on an FPGA grid. Such actual placement on an FPGA grid is during the fitting stage. The real-valued placement information output from global placement 202 is provided for a detailed placement, namely the fitting stage.

At 203 a congestion map is created and populated using information obtained from global placement at 202. A congestion map is generally an array of M by N bins, where M and N are integers.

Figure 4:
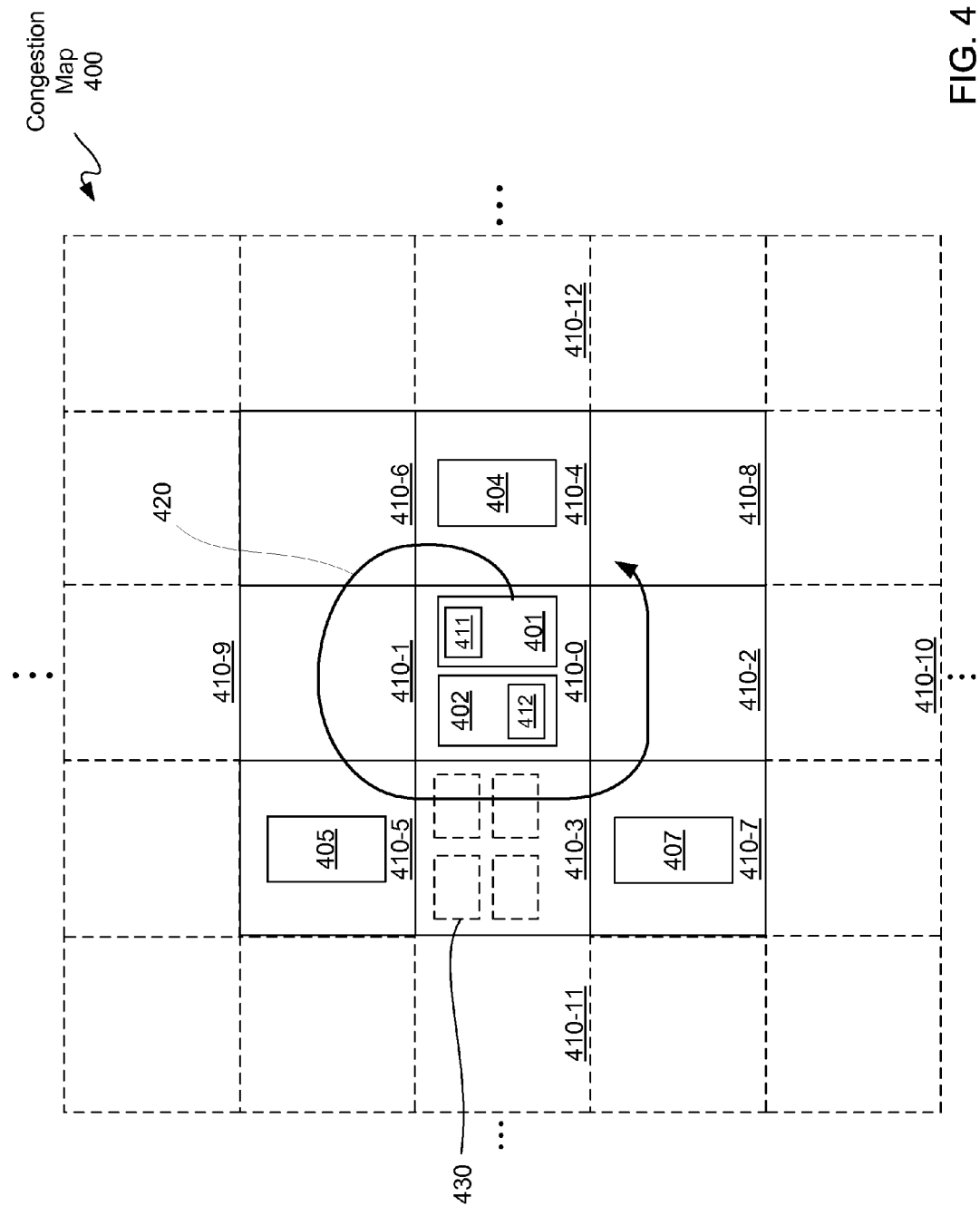
FIG. 4 is a block diagram depicting an exemplary embodiment of a congestion map.

FIG. 4 is a block diagram depicting an exemplary embodiment of a congestion map 400. A real-valued placement produced by a global placer is used to determine which bin a flip-flop or LUTRAM belongs to in a circuit device. For purposes of clarity by way of example and not limitation, control set restrictions, even though applicable to both flip-flops and LUTRAMS are described below with reference only to the flip-flops for purposes of clarity. However, even though flip-flops are used for describing a detailed placement algorithm, from such description it will be understood how to account for detailed placement of LUTRAMs as well.

Each bin 410-0 through 410-8 ("bins 410") of congestion map 400 has a finite supply of circuit resources. However, the granularity of bins 410 with respect to the number of resources each holds may be varied. In other words, a variable sized window may be used for defining bins 410 of congestion map 400. With respect to FPGAs, bins 410 of congestion map 400 may have a single slice, two slices, four slices, or more. A slice is circuit block having a predefined set of logic for forming an FPGA grid of field programmable circuit resources. Such field programmable circuit resources include field programmable logic gates that are configured responsive to programming configuration memory to provide control port outputs thereof to define such field programmable logic.

Flip-flops ("flops") within a bin 410 may be in slices, and slices may be defined by control set types of allocated flops. Thus, for example, a slice may be associated with a number of flops, and if a slice is "empty," then the number of available slots for flop allocation is the maximum available. So, for purposes of clarity by way of example and not limitation, if a slice has four flops, then an empty slice has four slots for allocation of such flops to place flops of a circuit design. Additionally, by flops it is meant clocked flops.

For purposes of clarity by way of example and not limitation, assume that bin 410-0, as well as each of bins 410-1 through 410-8, has four slices, as illustratively depicted with dashed boxes 430 in bin 410-3 though not shown in each of bins 410 for purposes of clarity. Further, assume circuit blocks 401 and 402 have been placed by global placement at 202 into bin 410-0. Additionally, assume that there are three separate control sets, A through C, associated with circuit blocks of a circuit design with a number of flip-flops associated with each of such control sets. For example, suppose control sets A, B, and C in bin 410-0 have numbers of flops as follows: control set A has ten flops, A(10); control set B has five flops, B(5); and control set C has two flops, C(2). Accordingly, there is a minimum number of flops that bin 410-0 would need to have in order to accommodate flops for control sets A through C. However, the "demand" of flops for control sets A through C may exceed the "supply" of flops in bin 410-0. The "demand" may be determined by determining the minimum number of slices based on the number of flops for each control set and the maximum number of flops per slice.

Continuing the above example, the "demand" for control set A is the total number of flops for control set A divided by the maximum number of flops in a slice, rounded up to the nearest whole number. Thus for the above example the demand for control set A is ten divided by four, rounded up to the nearest whole number, giving three. In other words, control set A fully utilizes two slices and part of a third slice, so it uses at least three slices. For control set B, five flops are divided by four flops per slice and rounded up, and thus control set B has a demand of two slices. Lastly, control set C has a demand of two flops divided by four flops per slice, namely a demand of one slice. In total, the demand of such control sets A through C is six slices. However, as previously indicated for the above example, there are only four slices in bin 410-0, namely the "supply" which is fixed based on the type of architecture and bin size. By subtracting the supply from the demand, namely six minus four, an overflow condition, namely an overflow of two slices, may be identified. In other words, the demand exceeds the supply by two slices for the above example.

With simultaneous reference to FIGS. 2 and 4, detailed placement flow 200 is further described. In addition to population of congestion map 400, overflow conditions for each of bins 410 of congestion map 400 are calculated at 203. Such calculations may be performed by a microprocessor, such as CPU 504 of FIG. 5.

At 204, bins 410 are sorted based on control set overflows. Bins may be sorted from a bin having a largest overflow and sequentially progressing down to a bin with the least overflow. For bins where demand does not exceed supply, namely non-overflowing bins, there still are flops to be placed. The non-overflowing bins may be ordered from greatest demand to least demand for placement of flops in bins with greater demand before placement of flops in bins with less demand. Accordingly, at 204, bins with and/or without overflows may be put in an ordered list for prioritizing placement of flops.

Moreover, within a bin, flops may be sorted for such placement. For example, flops may be sorted based on size and timing sensitivity with respect to operation of a circuit design, namely "timing criticality." If a flop is part of a larger primitive or "relationally placed macro" ("RPM"), then size of such flop may be the number of objects in such RPM. This sorting of flops may be used to place those flops that are more difficult to place first within a bin. So for example, larger objects may be more difficult to place than smaller objects, so larger objects may be placed first. Furthermore, if flops are of a same size, their timing criticality may be used to prioritize them, where flops that are in positions of more sensitive timing requirements are placed first. Accordingly, at 204, an ordered list of flops is produced for a detailed placement or "fitting."

RPMs may be user created by using "relative location" ("RLOC") constraints as well as tool generated. Placement algorithms conventionally treat a group of objects of an RPM as one entity for placement. All the child objects within an RPM are moved together, and offsets between the child objects generally determine the detailed placement thereof.

At 205, each slice is marked with a control set identifier. Empty slices will not have any prior control set identifier, and accordingly those slices are marked as empty or unused. If a placement to be performed is an incremental placement or a re-entrant placement, namely an incremental placement mode, there may be an existing placement for some circuit objects of a design. However, for purposes of clarity by way of example and not limitation, it shall be assumed that a fully unplaced circuit design is being implemented, and thus all slices are initially marked as unused, as a re-entrant placement shall be understood from the following description. Accordingly, at 205 as each slice is marked with a control set identifier to indicate it is unused.

At 206, a detailed placement is performed for any unplaced circuit resource. A first flop from the list generated at 204 is obtained, as described below in additional detail with reference to FIG. 3. It should be understood that the ordered list generated at 204 does not just contain overflow flops, rather the list generated at 204 includes all flops, as well as LUTRAMs as previously indicated, to be placed by a detailed placer ("fitter"). However, flops and LUTRAMs associated with overflowing bins 410 of a congestion map 400 are placed first. Again, however, for purposes of clarity by way of example and not limitation, only flops are discussed below.

For purposes of clarity by way of example and not limitation, if an ordered list of flops from the list generated at 204 has control sets A, C, B, A, A, A, B, B, . . . , then as flops are placed, control sets, in addition to a reduction in available flop slots, limit the number of available slices. With reference to FIG. 4, if a slice has been used for a flop 411 of circuit block or circuit block object 401, namely flop 411 has been placed in a slice of bin 410-0, and if flop 411 has control set A, then other flops with control sets B or C cannot be placed in such slice. Such slice used for circuit block 401 is hereinafter referenced as slice 401 for purposes of clarity; however, it should be understood that a placed circuit block may occupy a portion of a slice, all of a slice, more than one slice, or a combination thereof, with respect to circuit resources of a bin. If another flop with control set A is to be placed, and slice 401 is full but another slice in bin 410-0 is currently empty, then in the past such flop may be placed in an empty slice of bin 410-0 for example; however, this may negatively impact slice utilization if, for example, a slice used for circuit block 405 placed in bin 410-5 is also marked as a control set A and is partially full, namely has an open slot. Such slice used for circuit block 405 is hereinafter referenced as slice 405 for purposes of clarity. So, as described below in additional detail, placement may be biased in favor of use of a partially occupied slice over use of an empty nearest neighbor. It should be understood that a global placement conventionally places circuit objects for a best estimate of meeting performance parameters, including timing. However, by allowing some deviation, such as to a nearest neighbor, of such global placement, then slice utilization may be enhanced with a substantial likelihood of still meeting performance parameters, such as timing for example.

At 206, it is determined whether there is any flop that has not yet been placed. If there is no flop left to be placed, then other circuit objects, namely not sequential objects, are placed by a fitter at 207. By other objects, it is meant other circuit objects of a circuit design other than registers, clocked flops, LUTRAMs, or other non-sequential primitives. If there are no unplaced flops, then after fitting other circuit objects at 207, a placed design 208 may be output for storing in data storage 209. However, if there is any unplaced sequential circuit resource, such as a flop, as determined at 206, then a placement of such an unplaced sequential circuit resource is performed by a detailed placement routine at 206. After detailed placement routine 206 has completed placing all sequential circuit resources one at a time in the order of the list generated at 204, then at 207 other circuit objects are fit for purposes of detailed placement, as previously described.

Figure 3:
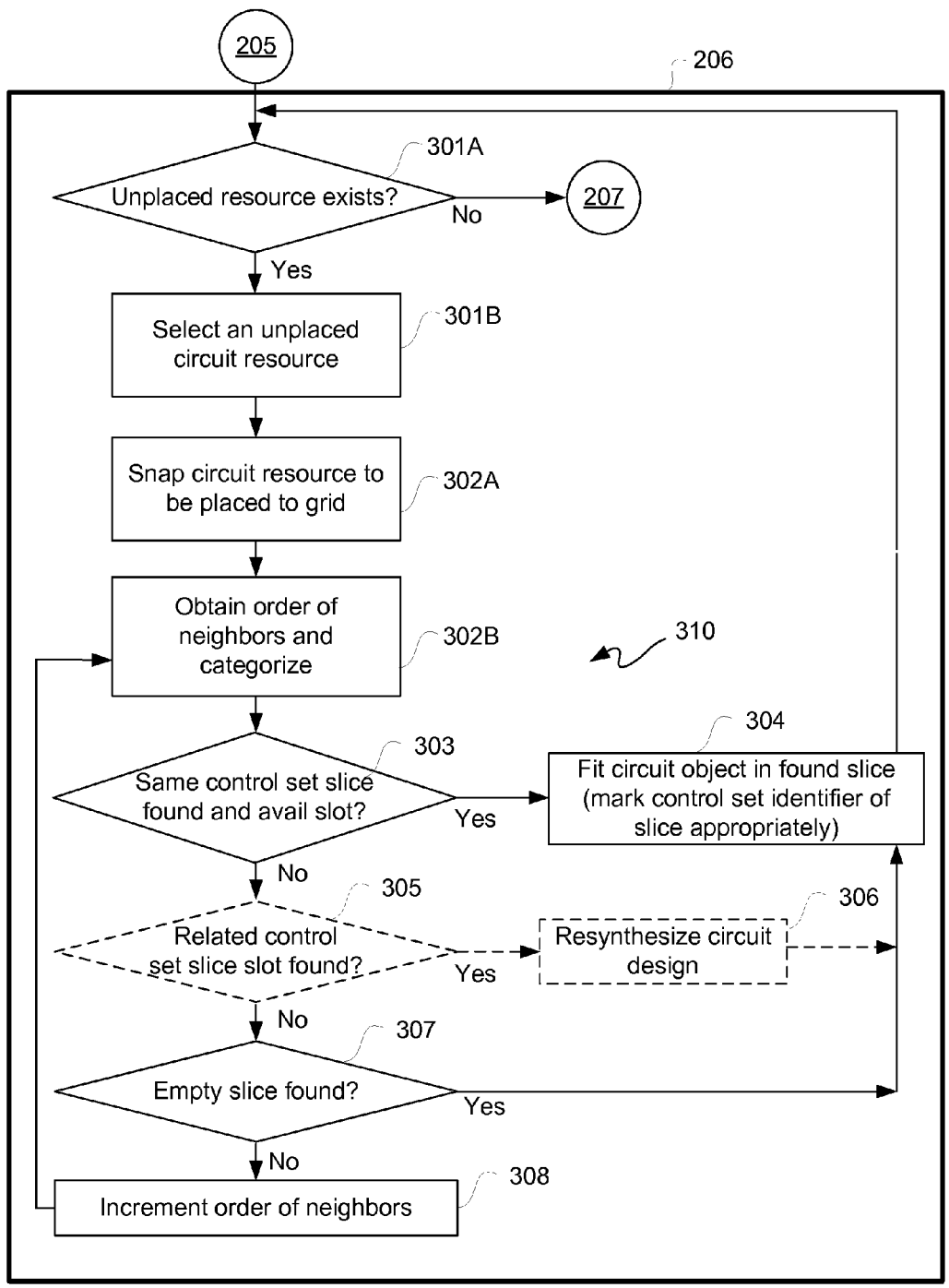
FIG. 3 is a flow diagram depicting an exemplary embodiment of a placement routine of the placement flow of FIG. 2.

FIG. 3 is a flow diagram depicting an exemplary embodiment of a detailed placement routine 206. At 301 it is determined whether there is any unplaced sequential circuit resource, which to continue the above example for purposes of clarity and not limitation is described in terms of flops even though other sequential circuit resources may be unplaced. If there is at least one unplaced sequential circuit resource, such as a flop, from the list generated at 204, then a sequential circuit resource is selected at 301B from such list according to order of priority.

At 302A such previously unplaced flop is "snapped" or "pinned" to a nearest location in an FPGA grid. By nearest location in an FPGA grid, it is mean a location in an FPGA grid associated with location of a slice that is nearest to an x, y co-ordinate obtained from the real-valued placement information for such flop obtained from global placement at 202.

Thus for example with simultaneous reference to FIGS. 2 through 4, an object flop or flop 411 may be "snapped" to a nearest location in an FPGA grid of a slice, such as slice object or slice 401 of bin 410-0. It should be understood that congestion map 400 reflects an FPGA grid, where bins 410 are generally associated with sites of slices. For a first flop, such flop 411 could be placed in slice 401 as all flop slots would be empty, continuing the above example, and thus bias for a neighborhood slice has no effect.

However, suppose that flop 411 is not a first flop to be placed, and suppose that there is no slot in slice 401 in which to place flop 411 even though slice 401 is of a same control set type as flop 411. Furthermore, suppose that a slice used for circuit resource block 402 in bin 410-0, hereinafter "slice 402" for clarity, is either empty or occupied by a flop object 412 of a different control set type than flop object 411. Then, flop object 411 is snapped to bin 410-0 or slice 401, and from such snapped location a breadth first search or spiral search, as generally indicated by arrow 420, is performed at 302B to obtain nearest neighbors, namely to collect nearest neighborhood slices of bin 410-0 of a wave front associated such spiral search. In this example, bins 410-1 through 410-8 are bins having slices that are nearest neighbors of bin 410-0.

At 302B, nearest neighborhood slices of bins 410-1 through 410-8 are categorized. The categories of slices include an identical control set type, a related control set type, an incompatible control set type, and empty.

At 303, it is determined whether a nearest neighbor slice in a wave front of an initial spiral search 420 has a same control set as that of a flop 411 to be placed. Suppose for purposes of clarity by way of example and not limitation that flop object 411 has control set A. Further, suppose that circuit blocks 405 and 404, hereinafter slices 405 and 404, respectively, for purposes of clarity, of bins 410-5 and 410-4, respectively, are of control set type A with available flop slots. Accordingly, the operation at 303 would be answered in an affirmative, and at 304 there may be an attempt to place or "fit" a circuit object, namely flop 411, in a slice associated with either slice 404 or slice 405, as those both have the same control set as flop 411, namely control set A, and at least one available flop slot. Again, even though there may be empty slices in nearest neighbor slices, including one or more slices in bin 410-0, the bias is to use a nearest neighbor partially used slice of a same control set type over an empty slice.

Because a flop 411 may in some instances have a choice of placement in nearest neighbor slices, priority among bins may be used for placement. Thus, at 304 there may be a preference among nearest neighbors. In this exemplary embodiment, bins 410-0 through 410-8 are ranked from highest priority to lowest priority, namely from zero to eight with zero being highest. This priority may be used to break a tie among two or more bin alternatives. For example, bin 410-4 has a higher priority than bin 410-5, and thus placement of flop 411 may be in bin 410-4.

At 304, flop 411, or more particularly the circuit object associated with flop 411, may be placed or fit in bin 410-4. From 304, a check is made again at 301A to determine if another flop in an ordered list of unplaced flops is yet to be placed, and if such other flop is yet unplaced then such flop is obtained at 301B. Again, it should be understood that an ordered list of flops was generated at 204, and thus the unplaced flops as determined at 301A and selected at 301B are obtained from such list in the order that they appear in the list generated at 204.

Suppose a next flop to be placed is flop 412, and flop 412 is of control set B. Further suppose that flop 412 is snapped at 302A to slice 402 also marked as control set B, but slice 402 is already full. If there is no other partially used slice with control set B in bin 410-0, then spiral search 420, previously used for flop 411, is used for flop 412 at 302B. Suppose that a slice associated with circuit block 407 of bin 410-7, hereinafter slice 407 for purposes of clarity, is marked as control set B but has no available slots for another flop. Then, even though at 303 a same control set slice is found in nearest neighbor slices, detailed placement 206 does not proceed to 304 due to a lack of availability in slice 407 of a slot. Accordingly, at 303 is determined whether both a same control set slice is found and whether availability of a slot for relocating a flop is present.

If there is no same control set slice having an available slot found at 303, then optionally at 305 a related control set slice having an available slot may be sought. For example, suppose slice 405 having control set type A is a related control set type of control set type B. Then the inquiry at 305, assuming there is an available slot in slice 405 for flop 412, may be answered in the affirmative for optional resynthesis of a circuit design at 306. In other words, flop 412 having control set type B may be resynthesized to have control set type A, and such flop would placed after such resynthesis in a slice having a control set type A identifier. Such resynthesized flop 412 may be placed at 304 in slice 405 having control set type A.

Alternatively, it may be that in order for there to be compatibility, one or more flops in slice 405 are to be resynthesized to control set type B. Thus, optionally at 306, such flops may be resynthesized to have control set type B, and at 304, flop 412 would be placed in circuit block 405 and circuit block 405 would be marked with a control set identifier of type B.

Resynthesis from control set type A to B or B to A depends on relationship among the control sets. For example, one control set may be a parent control set, and the other control set may be a child control set. A parent-child relationship exists between two control sets p and c when both control sets share the same clock and the control signals of p are a subset of the control signals of c. Thus, control sets can be arranged into hierarchical trees, with children below their parents. With respect to a control set tree, one may promote a flop from a child control set to a parent control set, for purposes of control set compatibility, by a resynthesis. Furthermore, siblings of a same parent may be promoted to a parent control set type. Thus if slice is marked as having a related control set type at 302B with respect to control set of a flop to be placed, resynthesis may be performed, and the slice may be marked with a control set type identifier of a parent flop. Resynthesis is described in additional detail in a co-pending patent application Ser. No. 12/272,496, filed Nov. 17, 2008, entitled "Placement Driven Control Set Resynthesis," by Sankaranarayanan Srinivasan, which is incorporated by reference herein in its entirety, and thus is not described in unnecessary detail herein.

Checking for a related control set slice and associated resynthesis are indicated as options, as resynthesis may add significant placement overhead, including affecting timing or other parameters of a previously synthesized circuit design. Furthermore, resynthesis may involve other overhead, which a user may wish to avoid. Accordingly, operations 305, and thus 306, may be optioned out, at least for an initial detailed placement.

Thus, by 307, no same control set slice is found, or no related control set slice is found if option 305 is invoked, or even if option 305 is invoked, any and all partially used slices, if any, found are marked as incompatible at 302B. Thus, at 307 it may be determined whether an empty slice is found among nearest neighbor slices. Thus, if there is no available same control set slice, and if resynthesis is not possible or not available, then an empty slice, if found, may be used.

Partially used slices are marked as incompatible at 302B for instances when control sets are not capable of being made equivalent via resynthesis. Thus, for example, if flop 412 is of control set type B, and slice 407, which has an available slot for a flop, is of control set type C, and control set type B and control set type C cannot be harmonized via resynthesis, then at 302B slice 407 would be categorized as incompatible with placement of flop 412.

Thus, at 307 an empty slice, if found in any of bins 410-0 through 410-8, may be used for placing flop 412. If more than one empty slice is available, again priority of nearest neighbors as previously described may be invoked.

Accordingly, at 304 a circuit object for flop 412 may be placed in an empty slice and such slice would be marked with a control set type B identifier in this example. Accordingly, it should be appreciated that using an empty slice even though it may not achieve as great a slice utilization as resynthesis, may be preferable to resynthesis provided a sufficient number of slices are available.

If no empty slice is found at 307, then at 308 the order of neighbors may be incremented, and at 302B a next order of nearest neighbors is obtained and categorized for flop 412 having previously been snapped at 302A. With reference to FIG. 4, if there was no bin of bins 410-1 through 410-8 that could accept flop 412 for example, then the next order of nearest neighbors, namely the nearest neighbors of bins 410-1 through 410-8 would be obtained by another spiral search. In other words, spiral search 420 would be expanded to include bins immediately adjacent to bins 410-1 through 410-8, namely to include bins 410-9, 410-10, 410-11, 410-12, among other bins as generally indicated with dashed boxes.

Thus a loop 310, generally including steps 302B, 303, 304, optionally 305, optionally 306, 307, and 308, may be repeated in order to obtain a next wave front of a spiral search to collect a next set of neighborhood slices. Furthermore, loop 310 may be repeated until a placement for a previously unplaced flop is obtained.

Iterations of loop 310 may be bounded in order to have a quality of result within a predetermined threshold. Furthermore, once such threshold is reached, then loop 310 may be initiated for placement of a flop with a resynthesis option invoked for obtaining a detailed placement.

Once all unplaced sequential resources are placed or fitted as determined at 301, then additional detail placement or fitting may be performed at 207 as previously described. It should further be understood that because mapping of a design ensures there is a sufficient number of resources in order to instantiate a design, there is a solution for detailed placement routine 206 to place all unplaced resources, even though such solution, at least after a first attempt to place all sequential objects without resynthesis, may involve resynthesis.

Figure 5:
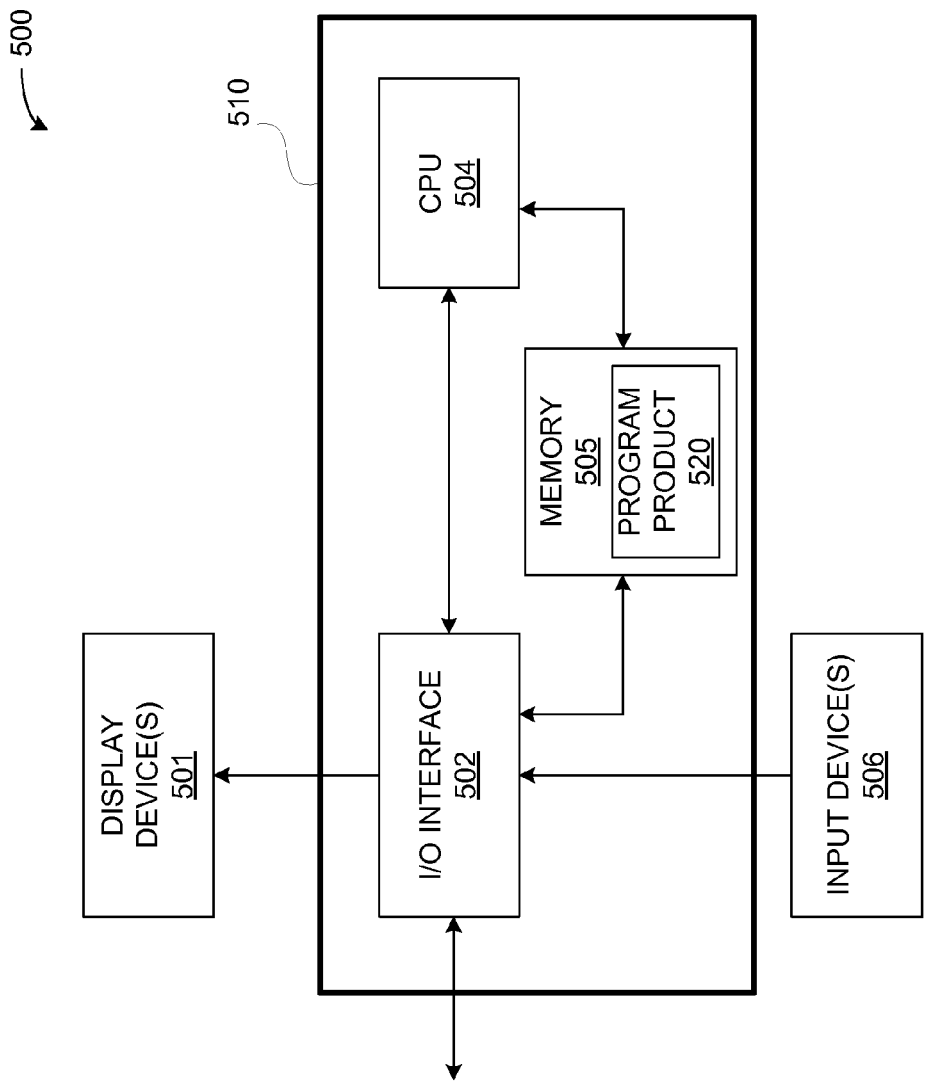
FIG. 5 is a block diagram depicting an exemplary embodiment of a computer system.

FIG. 5 is a high-level block diagram of an exemplary embodiment of a computer system 500. Computer system 500 may include a programmed computer 510 coupled to one or more display devices 501, such as Cathode Ray Tube ("CRT") displays, plasma displays, Liquid Crystal Displays ("LCDs"), and to one or more input devices 506, such as a keyboard and a cursor pointing device. Furthermore, a display device 501 may be a touch screen display device, and thus may include an input device. Other known configurations of a computer system may be used.

Programmed computer 510 may be programmed with a known operating system, which may be Mac OS, Java Virtual Machine, Linux, Solaris, UNIX, or a Windows operating system, among other known platforms. Programmed computer 510 includes a central processing unit (CPU) 504, memory 505, and an input/output ("I/O") interface 502. CPU 504 may be a type of microprocessor known in the art, such as available from IBM, Intel, ARM, and Advanced Micro Devices for example. Support circuits (not shown) may include conventional cache, power supplies, clock circuits, data registers, and the like. Memory 505 may be directly coupled to CPU 504 or coupled through I/O interface 502. At least a portion of an operating system may be disposed in memory 505. Memory 505 may include one or more of the following: random access memory, read only memory, magneto-resistive read/write memory, optical read/write memory, cache memory, magnetic read/write memory, and the like, as well as signal-bearing media as described below.

I/O interface 502 may include chip set chips, graphics processors, and daughter cards, among other known circuits. An example of a daughter card may include a network interface card ("NIC"), a display interface card, a modem card, and a Universal Serial Bus ("USB") interface card, among other known circuits. Thus, I/O interface 502 may be coupled to a conventional keyboard, network, mouse, display printer, and interface circuitry adapted to receive and transmit data, such as data files and the like. Programmed computer 510 may be coupled to a number of client computers, server computers, or any combination thereof via a conventional network infrastructure, such as a company's Intranet and/or the Internet, for example, allowing distributed use for interface generation.

Memory 505 may store all or portions of one or more programs or data to implement processes in accordance with one or more aspects of the invention to provide a placement engine with at least placement routine 206 of FIG. 2 ("program product") 520. Program product 520 may further include instructions for one or more steps described with reference to operations 202 through 205, and 207 of FIG. 2. Additionally, those skilled in the art will appreciate that one or more aspects of the invention may be implemented in hardware, software, or a combination of hardware and software. Such implementations may include a number of processors independently executing various programs and dedicated hardware or programmable hardware.

One or more program(s) of the program product 520, as well as documents thereof, may define functions of embodiments in accordance with one or more aspects of the invention and can be contained on a variety of signal-bearing media, such as computer-readable media having code, which include, but are not limited to: (i) information permanently stored on non-writable storage media (e.g., read-only memory devices within a computer such as CD-ROM or DVD-ROM disks readable by a CD-ROM drive or a DVD drive); or (ii) alterable information stored on writable storage media (e.g., floppy disks within a diskette drive or hard-disk drive or read/writable CD or read/writable DVD). The above embodiments specifically include information downloaded from the Internet and other networks. Such signal-bearing media, when carrying computer-readable instructions that direct functions of one or more aspects of the invention, represent embodiments of the invention.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A method for fitting a circuit design having been synthesized, comprising:
    identifying overflow conditions from a first placement of a mapped circuit design in association with an integrated circuit;
    marking circuit blocks associated with the integrated circuit with control set identifiers;
    implementing a second placement for a first circuit object from a list of sequential circuit objects generated responsive at least in part to the overflow conditions, wherein the first circuit object is associated with a first control set identifier, wherein the second placement comprises:
        locating a site for placement of the first circuit object, wherein the site is associated with a first circuit resource block, and the first circuit resource block is associated with circuit resource blocks of the integrated circuit;
        categorizing nearest neighbor circuit resource blocks of the first circuit resource block in response to statuses, wherein the statuses include categories of control set identifiers and an unused category; and
        placing, with a placer operating in a computer, the first circuit object in a nearest neighbor of the nearest neighbor circuit resource blocks of the first circuit resource block for the second placement, wherein the nearest neighbor is associated with a categorization from the act of categorizing including the first control set identifier of the first circuit object.

2. The method according to claim 1, further comprising repeating the locating, the categorizing, and the placing for each of the sequential circuit objects on the list to complete the second placement.

3. The method according to claim 1, wherein:
    the categorizing of the nearest neighbor circuit resource blocks includes labeling the nearest neighbor circuit resource blocks as one of identical to the first control set identifier, related to the first control set identifier, incompatible with the first control set identifier, or unused.

4. The method according to claim 3, further comprising:
    sorting the overflow conditions of the circuit resource blocks used in the first placement from most overflowing to least overflowing to provide the list; and
    initiating the second placement by selection of the first circuit object in association with the first circuit resource block, wherein the first circuit resource block is the most overflowing.

5. The method according to claim 4, further comprising:
    sorting the sequential circuit objects according to size and timing to provide the list.

6. The method according to claim 5, wherein:
    the sequential circuit objects are sized responsive to number of objects in associated RPMs.

7. The method according to claim 3, wherein:
    the first placement is a global placement; and
    the second placement is a detailed placement.

8. The method according to claim 1, wherein the sequential circuit objects include registers.

9. The method according to claim 1, further comprising:
    acquiring nearest neighbor circuit resource blocks with respect to the first circuit resource block by:
    snapping the first circuit object to the site;
    the site being associated with a grid of the circuit resource blocks; and
    performing a first spiral search to acquire the nearest neighbor circuit resource blocks of the first circuit resource block.

10. The method according to claim 9, wherein:
    the integrated circuit is a Field Programmable Gate Array ("FPGA"); and
    the grid is an FPGA grid of the circuit resource blocks.

11. The method according to claim 10, wherein the sequential circuit objects represent clocked flip-flops and look-up table random access memories.

12. The method according to claim 9, wherein the acquiring of the nearest neighbor circuit resource blocks of the first circuit resource block is for a portion of the congestion map responsive to a scalable window.

13. The method according to claim 12, wherein:
    the integrated circuit is a Field Programmable Gate Array ("FPGA");
    the grid is an FPGA grid of the circuit resource blocks;
    the scalable window is for selection of a portion of the FPGA grid; and
    the scalable window has a granularity of at least one slice per bin of the congestion map.

14. The method according to claim 1, wherein the placing of the first circuit object in the nearest neighbor of the nearest neighbor circuit resource blocks of the first circuit resource block is favored over placement in another of the nearest neighbor circuit resource blocks having a higher priority but with an unused status.

15. The method according to claim 2, further comprising:
    selecting a second circuit object from the list of the sequential circuit objects;
    the second circuit object associated with a second control set identifier different from the first control set identifier;
    locating another site for placement of the second circuit object;

the other site being associated with a second circuit resource block;

the second circuit resource block being associated with the circuit resource blocks of the integrated circuit;

acquiring nearest neighbor circuit resource blocks with respect to the second circuit resource block;

categorizing the nearest neighbor circuit resource blocks of the second circuit resource block responsive to statuses thereof;

placing the second circuit object in a nearest neighbor of the nearest neighbor circuit resource blocks of the second circuit resource block having the unused status for the second placement;

the nearest neighbor having associated therewith another categorization from the categorizing including the second control set identifier of the second circuit object;

the first control set identifier and the second control set identifier being related wherein the first circuit object and the second circuit object are capable of being resynthesized for placement of the second circuit object in the first circuit object; and the placing of the second circuit object in the nearest neighbor of the nearest neighbor circuit resource blocks of the second circuit resource block is favored over yet another of the nearest neighbor circuit resource blocks having another higher priority with a compatible status.

16. A non-transitory machine-readable medium having stored thereon information representing instructions that, when executed by a processor, cause the processor to perform operations comprising:

identifying overflow conditions from a first placement of a mapped circuit design in association with an integrated circuit;

marking circuit blocks associated with the integrated circuit with control set identifiers;

implementing a second placement for a first circuit object from a list of sequential circuit objects generated responsive at least in part to the overflow conditions, wherein the first circuit object is associated with a first control set identifier, wherein the second placement comprises:

locating a site for placement of the first circuit object, wherein the site is associated with a first circuit resource block, and the first circuit resource block is associated with circuit resource blocks of the integrated circuit;

categorizing nearest neighbor circuit resource blocks of the first circuit resource block in response to statuses, wherein the statuses include categories of control set identifiers and an unused category; and placing, with a placer operative with the processor, the first circuit object in a nearest neighbor of the nearest neighbor circuit resource blocks of the first circuit resource block for the second placement, wherein the nearest neighbor is associated with a categorization from the act of categorizing including the first control set identifier of the first circuit object.

17. A method for fitting a circuit design having been synthesized, comprising:

obtaining a mapped design for the circuit design;

performing a first placement of the mapped design in association with an integrated circuit;

marking circuit blocks associated with the integrated circuit with control set identifiers;

selecting a first circuit object from a list of the sequential circuit objects, wherein the first circuit object is associated with a first control set identifier;

locating a site for placement of the first circuit object, wherein the site is associated with a first circuit resource block, and the first circuit resource block is associated with circuit resource blocks of the integrated circuit;

acquiring nearest neighbor circuit resource blocks with respect to the first circuit resource block;

categorizing the nearest neighbor circuit resource blocks of the first circuit resource block in response to statuses;

placing, with a placer operating in a computer, the first circuit object in a nearest neighbor of the nearest neighbor circuit resource blocks of the first circuit resource block for a second placement, wherein the nearest neighbor is associated therewith a categorization from the act of categorizing including the first control set identifier of the first circuit object.

18. The method according to claim 17, further comprising:

generating a congestion map responsive to the first placement;

identifying overflow conditions in the congestion map;

creating a list of sequential circuit objects for the second placement responsive at least in part to the overflow conditions identified; and the overflow conditions calculated with a processor of the computer.

19. The method according to claim 18, further comprising repeating the selecting, the locating, the acquiring, the categorizing, and the placing for each of the sequential circuit objects on the list to complete the second placement.

20. The method according to claim 19, wherein:

the statuses include categories of control set identifiers and an unused category; and the categorizing of the nearest neighbor circuit resource blocks includes labeling the nearest neighbor circuit resource blocks as one of identical to the first control set identifier, related to the first control set identifier, incompatible with the first control set identifier, or unused.

* * * * *